United States Patent
Kazi

(10) Patent No.: US 11,474,902 B2
(45) Date of Patent: Oct. 18, 2022

(54) INDICATING DATA HEALTH IN A DSN MEMORY

(71) Applicant: International Business Machines Corporation, Armonk, NY (US)

(72) Inventor: Asimuddin Kazi, Naperville, IL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 22 days.

(21) Appl. No.: 16/519,748

(22) Filed: Jul. 23, 2019

(65) Prior Publication Data

US 2019/0347163 A1    Nov. 14, 2019

Related U.S. Application Data

(63) Continuation of application No. 15/612,997, filed on Jun. 2, 2017, now Pat. No. 10,467,097.

(51) Int. Cl.
| | |
|---|---|
| *G06F 11/00* | (2006.01) |
| *G06F 11/10* | (2006.01) |
| *G06F 11/30* | (2006.01) |
| *G06F 11/34* | (2006.01) |
| *H03M 13/37* | (2006.01) |
| *H03M 13/15* | (2006.01) |

(52) U.S. Cl.
CPC ...... *G06F 11/1092* (2013.01); *G06F 11/1076* (2013.01); *G06F 11/1088* (2013.01); *G06F 11/3006* (2013.01); *G06F 11/3034* (2013.01); *G06F 11/3055* (2013.01); *G06F 11/3495* (2013.01); *H03M 13/373* (2013.01); *H03M 13/3761* (2013.01); *H03M 13/1515* (2013.01)

(58) Field of Classification Search
None
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |

(Continued)

OTHER PUBLICATIONS

Google Scholar/Patents search report, Oct. 9, 2020 (Year: 2020).*

(Continued)

*Primary Examiner* — Christopher S McCarthy
(74) *Attorney, Agent, or Firm* — Randy E. Tejeda; Andrew D. Wright; Roberts Calderon Safran & Cole, P.C.

(57) ABSTRACT

A method includes acquiring, by a managing unit of a dispersed storage network (DSN), storage unit status information and data object storage status information from a plurality of storage units of DSN memory of the DSN. The method further includes determining, by the managing unit, DSN status information of the DSN memory based on the storage unit status information and the data object storage status information. The method further includes identifying, by the managing unit, DSN memory issues within the DSN memory. The method further includes prioritizing, by the managing unit, corrective remedies for the DSN memory issues based on the status information of the DSN memory. The method further includes facilitating, by the managing unit, the execution of the prioritized corrective remedies to correct the DSN memory issues.

20 Claims, 7 Drawing Sheets

FIG. 1

(56) References Cited

U.S. PATENT DOCUMENTS

| | | | |
|---|---|---|---|
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,321,643 B1* | 11/2012 | Vaghani | G06F 3/0604 |
| | | | 711/E12.002 |
| 9,552,261 B2* | 1/2017 | Resch | G06F 11/1076 |
| 9,842,017 B1* | 12/2017 | Zhang | G06F 11/3452 |
| 10,467,097 B2 | 11/2019 | Kazi | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0205143 A1* | 10/2004 | Uemura | H04L 67/1097 |
| | | | 709/208 |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0185141 A1 | 7/2011 | Dhuse et al. | |
| 2012/0311068 A1 | 12/2012 | Gladwin et al. | |
| 2013/0326264 A1 | 12/2013 | Resch | |
| 2014/0019579 A1* | 1/2014 | Motwani | G06F 3/0614 |
| | | | 709/216 |
| 2015/0205668 A1* | 7/2015 | Sundaram | G06F 3/0688 |
| | | | 714/6.24 |
| 2017/0090767 A1* | 3/2017 | Poston | G06F 11/16 |
| 2017/0091036 A1 | 3/2017 | Peake | |
| 2017/0123919 A1 | 5/2017 | Baptist et al. | |
| 2017/0132081 A1 | 5/2017 | Gladwin et al. | |
| 2017/0161162 A1* | 6/2017 | Blea | G06F 11/2069 |
| 2017/0289250 A1* | 10/2017 | Baptist | H04L 67/28 |

OTHER PUBLICATIONS

Google Scholar/Patents—text refined (Year: 2021).*
Google Scholar/Patents—search report—text refined (Year: 2022).*
Google Scholar/Patents search—text refined (Year: 2022).*
Chung; An Automatic Data Segmentation Method for 3D Measured Data Points; National Taiwan University; pp. 1-8; 1998.
Harrison; Lightweight Directory Access Protocol (LDAP): Authentication Methods and Security Mechanisms; IETF Network Working Group; RFC 4513; Jun. 2006; pp. 1-32.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.
Legg; Lightweight Directory Access Protocol (LDAP): Syntaxes and Matching Rules; IETF Network Working Group; RFC 4517; Jun. 2006; pp. 1-50.
Plank, T1: Erasure Codes for Storage Applications; FAST2005, 4th Usenix Conference on File Storage Technologies; Dec. 13-16, 2005; pp. 1-74.
Rabin; Efficient Dispersal of Information for Security, Load Balancing, and Fault Tolerance; Journal of the Association tor Computer Machinery; vol. 36, No. 2; Apr. 1989; pp. 335-348.
Satran, et al.; Internet Small Computer Systems Interface (iSCSI); IETF Network Working Group; RFC 3720; Apr. 2004; pp. 1-257.
Sciberras; Lightweight Directory Access Protocol (LDAP): Schema for User Applications; IETF Network Working Group; RFC 4519; Jun. 2006; pp. 1-33.
Sermersheim; Lightweight Directory Access Protocol (LDAP): The Protocol; IETF Network Working Group; RFC 4511; Jun. 2006; pp. 1-68.
Shamair; How to Share a Secret; Communications of the ACM; vol. 22, No. 11; Nov. 1979; pp. 612-613.
Smith; Lightweight Directory Access Protocol (LDAP): String Representation of Search Filters; IETF Network Working Group; RFC 4515; Jun. 2006; pp. 1-12.
Smith; Lightweight Directory Access Protocol (LDAP): Uniform Resource Locator; IETF Network Working Group RFC 4516; Jun. 2006; pp. 1-15.
Wildi; Java iSCSi Initiator; Master Thesis; Department of Computer and Information Science, University of Konstanz; Feb. 2007; 60 pgs.
Xin, et al.; Evaluation of Distributed Recovery in Large-Scale Storage Systems; 13th IEEE International Symposium on High Performance Distributed Computing; Jun. 2004; pp. 172-181.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): Directory Information Models; IETF Network Working Group; RFC 4512; Jun. 2006; pp. 1-49.

(56) References Cited

OTHER PUBLICATIONS

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

List of IBM Patents or Patent Applications Treated as Related, dated Aug. 27, 2020, 1 page.

* cited by examiner

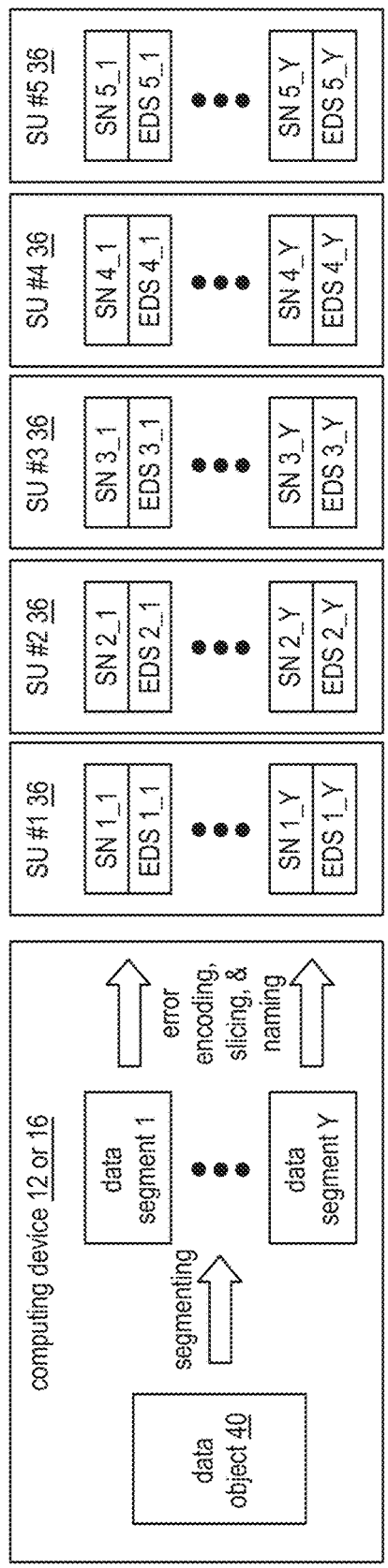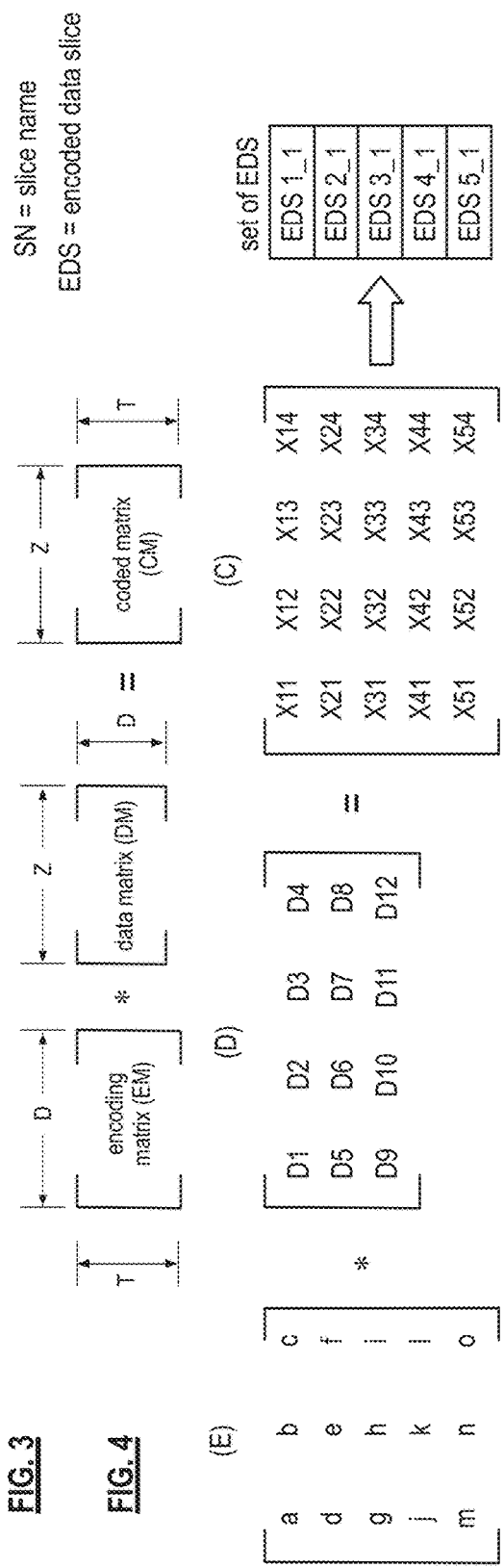

storage unit status info 82

| SU name | available mem | reliability | data throughput | error rate | usage | bad slices |
|---|---|---|---|---|---|---|
| SU 1_1 | 5% | low | low | medium | high | 3 |
| SU 1_2 | 25% | high | medium | low | high | 0 |
| ... | | | | | | |
| SU 1_n | 10% | medium | high | low | medium | 2 | data object storage status info 84

| DO name | DO size | # slices | # segments | # bad slices | # bad slices/set |
|---|---|---|---|---|---|
| a3 | 20KB | Y | 3 | 3 | 2/set 1; 1/set Y |

⇒

DSN status information 86

| source name | time rebuild required | time of storage issue | priority level of rebuild | priority level of SU remedy |
|---|---|---|---|---|
| SU 1_1 | N/A | old | N/A | high |
| SU 1_2 | N/A | somewhat recent | N/A | low |
| SU 1_n | N/A | recent | N/A | medium |
| EDS 1_1_a3 | 1 hr | somewhat recent | medium | N/A |
| EDS 2_1_a3 | 5 min | old | high | N/A |
| EDS 1_Y_a3 | 2 hr | recent | low | N/A |

FIG. 9B

INDICATING DATA HEALTH IN A DSN MEMORY

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage. Indicating and correcting data health issues within a dispersed storage network present unique issues. Data health issues can occur on a storage unit level, a memory device level, and a data object level and require the proper monitoring and corrective remedies.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIGS. 9A and 9B are schematic block diagrams of an embodiment of an example of identifying and remedying dispersed storage network (DSN) memory issues in accordance with the present invention.

DETAILED DESCRIPTION OF THE INVENTION

Figure 1:
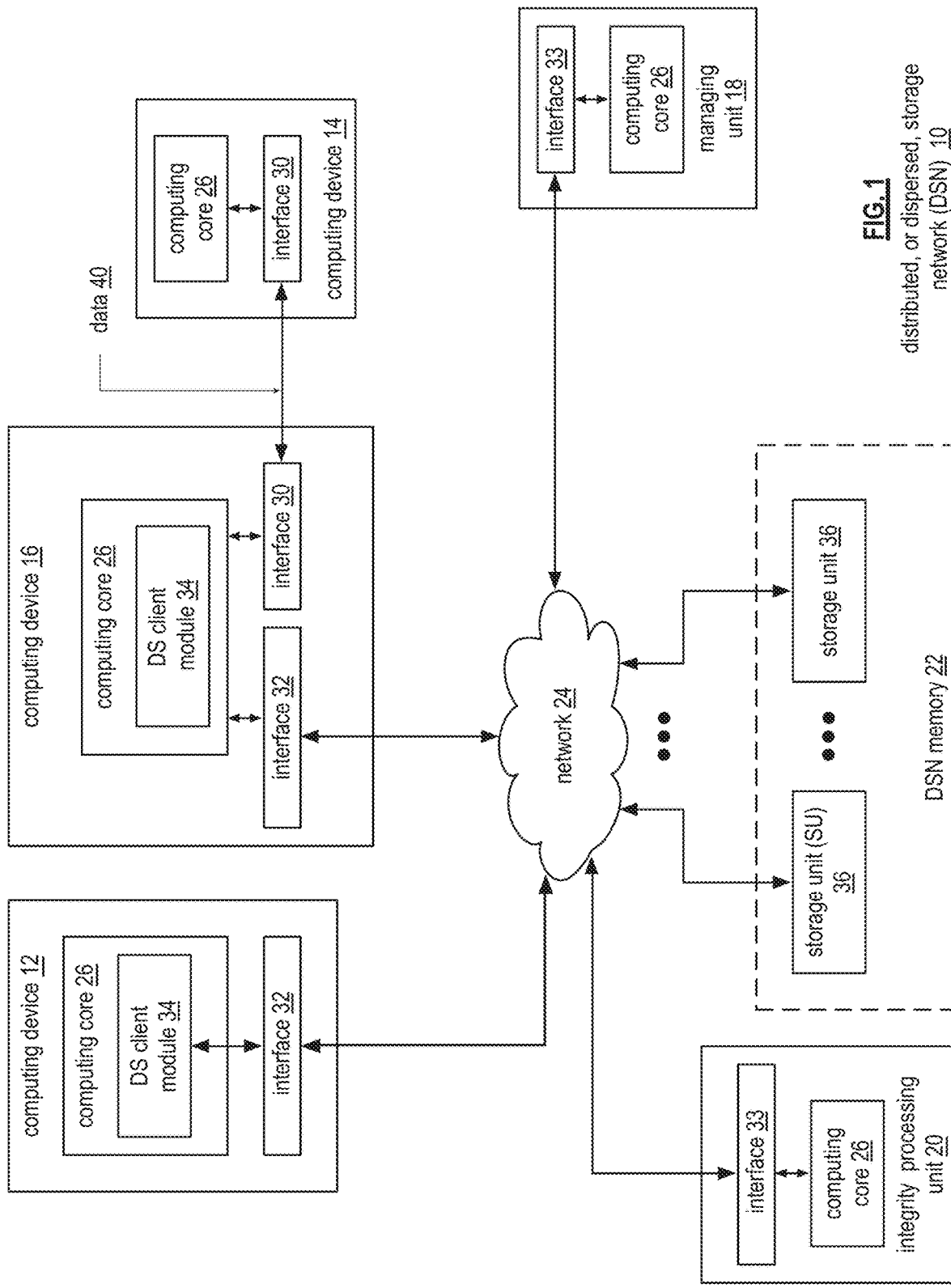
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
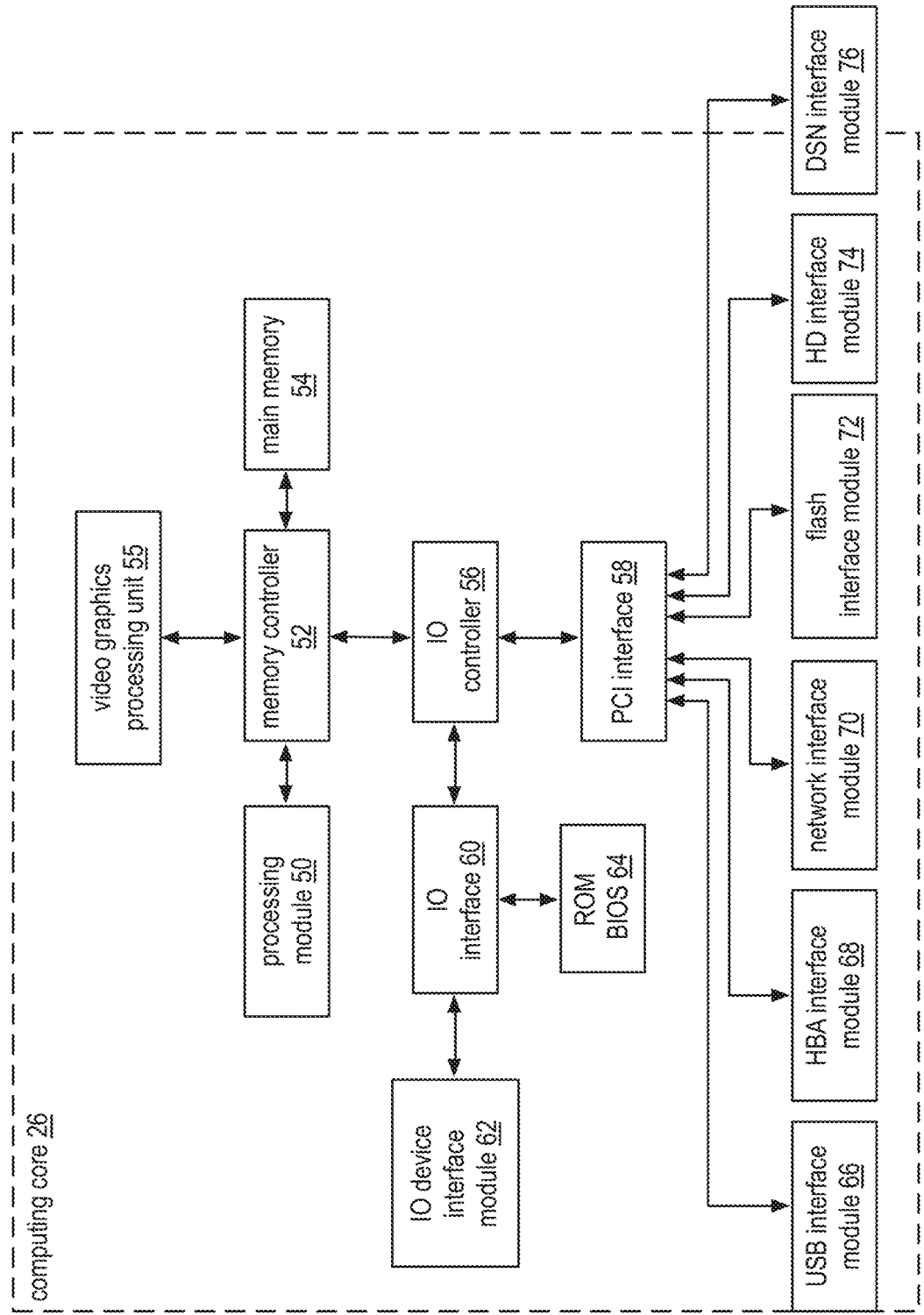
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
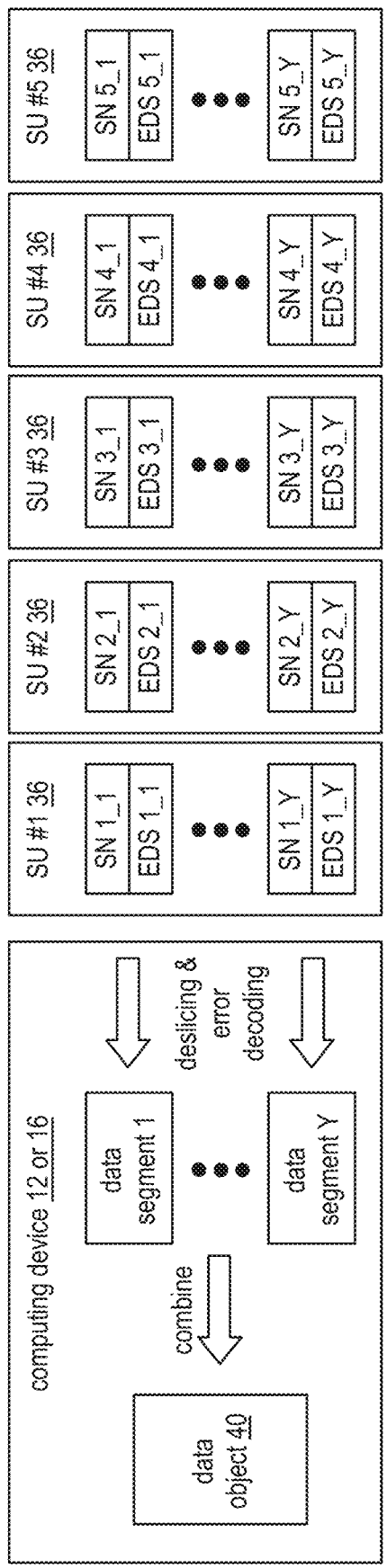
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
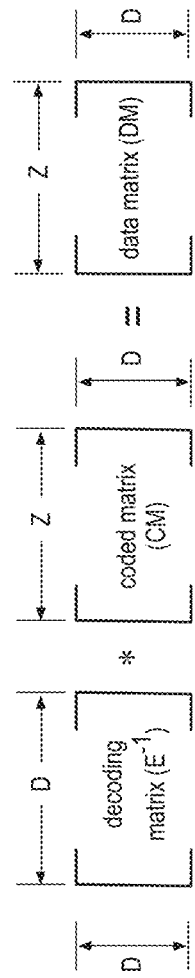
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9A:
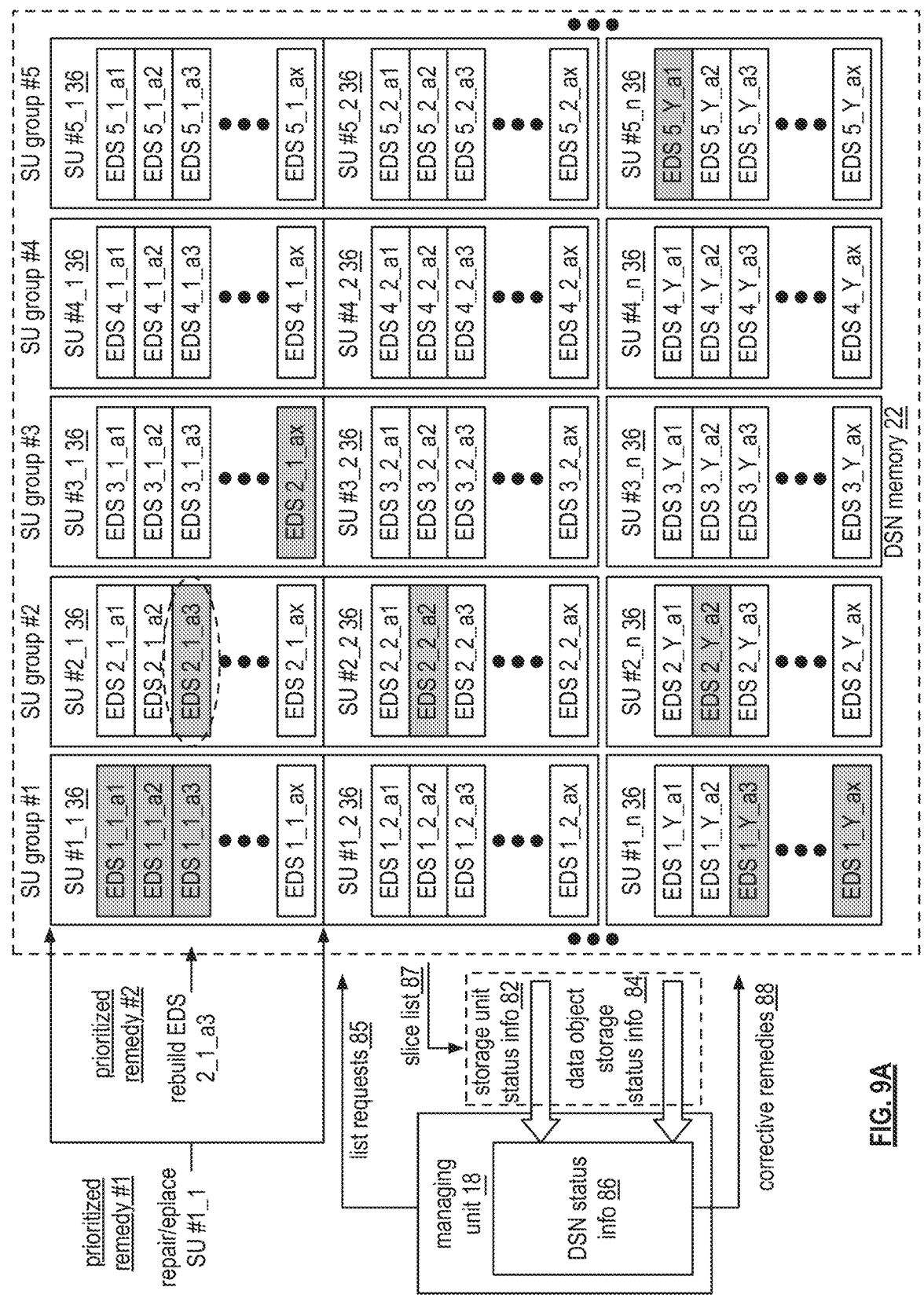

FIGS. 9A and 9B are schematic block diagrams of an example of identifying and remedying dispersed storage network (DSN) memory issues. FIG. 9A includes the managing unit 18 and the DSN memory 22 of FIG. 1. The DSN memory 22 includes storage unit groups 1-5 (SU group #1 through SU group #5). Each storage unit group includes a plurality of storage units 36. For example, storage group #1 includes SU #1_1 36 through SU #1_n 36. The plurality of storage units stores pluralities of sets of error encoded data slices (EDSs). Each plurality of sets of encoded data slices corresponds to the dispersed error encoding of a data object. Each encoded data slice of each set of encoded data slices is uniquely identified by its slice name, which is also used as at least part of a logical DSN address for storing the encoded data slice. For simplicity, the slice names shown in FIG. 9A include pillar number, data segment number, and data object ID but may further include information such as vault ID and revision level information of the encoded data slices. For example, data object a1 is dispersed error encoded into a plurality of sets of encoded data slices. A first set of encoded data slices of the plurality of sets of encoded data slices of data object a1 includes EDS 1_1_a1 through EDS 5_1_a1 stored in SU #1_1 through SU #5_1 respectively. The slice name EDS 1_1_a1 corresponds to a first error encoded data slice (pillar number) of a first data segment of data object "a1."

The managing unit 18 acquires storage unit status information 82 and data object storage status information 84 from the plurality of storage units of the DSN memory 22 and organizes the information using a dispersed data structure, log, table, database or other mechanism. The storage unit status information 82 is a compilation of the status (i.e., health) of each storage unit in the DSN memory. The storage unit status information 82 includes the storage unit name, memory availability, storage unit reliability (e.g., the percentage of time the storage unit is offline), data throughput, error rate, storage unit usage rate, and the number of encoded data slices of each storage unit of the plurality of storage units having a storage unit storage issue. The storage unit status information 82 (with the exception of storage unit reliability) may indicate a storage issue at the storage unit level and/or the memory device level.

The data object storage status information 84 is a compilation of the status (i.e., health) of each data object stored in the DSN memory 22 and includes data object name, the size of the data object (including the number of data segments per object and the number of encoded data slices per segment), the total number of encoded data slices of the plurality of sets of encoded data slices having a data object storage issue, and the number of encoded data slices of each set of encoded data slices of the sets of encoded data slices of the data object having a data object storage issue from the identified encoded data slices. To acquire the encoded data slice information of the storage unit status information 82 and data object storage status information 84, the managing unit 18 issues a plurality of list requests 85 to the plurality of storage units of the DSN memory 22. A list request of the plurality of list requests 85 includes a request for a list of slice names 87 regarding encoded data slices stored by a storage unit of the plurality of storage units.

The managing unit 18 interprets the list of slice names 87 to identify encoded data slices having a storage issue. Encoded data slices have a storage issue are shaded in FIG. 9A. The storage issue includes one or more of a storage unit storage issue and a data object storage issue. For each identified encoded slice of the identified encoded data slices having the storage issue, the managing unit 18 further determines whether the type of storage issue is one of a missing encoded data slice, a wrong revision, and a corrupted encoded data slice. When the type of storage issue is one of the missing encoded data slice and the corrupted encoded data slice, the managing unit determines the storage unit issue to be a storage unit storage issue. For example, the encoded data slice could be missing because the storage unit was offline and never received the encoded data slice for storage. Further, the encoded data slice could be missing because the storage unit received it but stored it in a failed memory device. The encoded data slice may be intentionally corrupted or unintentionally corrupted (e.g., by a software or hardware glitch). When the type of storage issue is one of the missing encoded data slice, the wrong revision, and the corrupted encoded data slice, the managing unit determines the storage unit issue to be a data object storage issue. An encoded data slice is a wrong revision encoded data slice when it is of a different (e.g., old) revision than other encoded data slices in the set of encoded data slices. This may occur due to a DS processing error. The encoded data slice may be missing or corrupted for other reasons besides storage unit malfunctions. For example, the encoded data slice may be missing due to a DS processing or user error. Whether a storage unit issue caused the missing or corrupted encoded data slice or not, the information is included as a data object storage issue because it is an indicator of overall data object health.

Therefore, from the list of identified encoded data slices, the managing unit 18 determines the number of encoded data slices of each storage unit of the plurality of storage units having a storage unit storage issue, and the total number of encoded data slices of the plurality of sets of encoded data slices having a data object storage issue. By using the encoded data slice name of the identified encoded data slices and data object size information of the data object storage status information 84 the managing unit 18 is also able to determine the number of encoded data slices of each set of encoded data slices of the sets of encoded data slices of the data object having a data object storage issue. The managing unit 18 adds this information to the storage unit status information 82 and the data object storage status information 84 organized in the dispersed data structure, log, table, database or other mechanism.

An example of storage unit status information 82 regarding the storage units in storage group #1 (SU #1_1 through SU #1_n) of FIG. 9A and an example of data object storage status information 84 regarding data object a3 of FIG. 9A are shown in FIG. 9B. The storage unit status information 82 includes the storage unit name of SU #1_1 through SU #1_n, the available memory in each storage unit, the reliability of each storage unit, the data throughput of each storage unit, the error rate of each storage unit, the usage of each storage unit, and the number of "bad" slices per storage unit (e.g., missing or corrupted encoded data slices). Available memory is shown as a percentage of unused memory. For example, the storage unit status information 82 indicates that SU #1_1 has a relatively low memory availability of 5% available memory. Reliability is indicated as low, medium, or high and is based on data the managing unit 18 has collected and stored over time. A low reliability may indicate that the storage unit has been offline for a percentage of time throughout operation that is higher than a set standard (e.g., the storage unit is offline more than 5% of the time). A medium reliability may indicate that the storage unit has been offline for a percentage of time throughout operation that is approaching the standard (e.g., the storage unit is offline between 1-5% of the time). A high reliability may indicate that the storage unit has been offline for a negligible percentage of time throughout operation (e.g., the storage unit is offline less than 1% of the time).

Data throughput is also indicated as low, medium, or high and depends on the type of system and the data being transmitted. For example, data throughput could range from 100 Kbits per second to terabits per second and low, medium, or high data throughput will therefore depend on the desired data transmission of the particular system. Storage unit error rate is also indicated as low, medium, or high and depends on the type of system and data being transmitted. As an example, a low error rate may be 1 bit error per megabit (i.e., an error rate of 10 to the minus 6). Storage unit usage is also indicated as low, medium, or high for simplicity and corresponds to the usage rate of the storage unit, but could also indicate individual memory device usage within the storage unit. As shown in FIG. 9B, SU #1_1's storage unit status information 82 indicates that is has 5% available memory, low reliability, low data throughput, a medium error rate, and high storage unit usage. SU #1_1 also stores a total of 3 "bad slices" (i.e., encoded data slices identified as corrupt or missing (e.g., shaded encoded data slices, EDS 1_1_a1, EDS 1_1_a2, EDS 1_1_a3 of FIG. 9A)).

The data object storage status information 84 of data object a3 includes data object a3's data object name, the size of data object a3 (including the number of data segments per object and the number of encoded data slices per segment), the total number of encoded data slices of the plurality of sets of encoded data slices having a data object storage issue, and the number of encoded data slices of each set of encoded data slices of the sets of encoded data slices of data object a3 having a data object storage issue from the identified encoded data slices. The data object storage status information 84 regarding data object a3 indicates that data object a3 is 20 KB, has Y number of encoded data slices, 3 segments, 3 total "bad slices" (i.e., encoded data slices identified as corrupt, a wrong revision, or missing), 2 bad slices in a first set of encoded data slices (e.g., EDS 1_1_a3 and EDS 2_1_a3 of FIG. 9A), and 1 bad slice in a Y set of encoded data slices (e.g., EDS 1_Y_ax of FIG. 9A).

The managing unit 18 determines DSN status information 86 of the DSN memory based on the storage unit status information 82 and the data object storage status information 84. FIG. 9B shows an example of DSN status information 86 based on the storage unit status information of SU #1_1, SU #1_2, and SU #1_n of FIG. 9A and the data object storage status information 84 regarding EDS 1_1_a3, EDS 2_1_a3, and EDS 1_Y_a3 of data object a3 of FIG. 9A. The managing unit 18 determines the DSN status information 86 by determining one or more of: a scheduled time that each encoded data slice of a number of encoded data slices having storage issues requires rebuilding, a length of time that each encoded data slice of the number of encoded data slices having storage issues has had its corresponding storage issue, a length of time that each storage unit of a number of storage units having storage issues has had its corresponding storage issue, a rebuilding priority level for each encoded data slice of the number of encoded data slices having storage issues, and a storage unit remedy priority level for each storage unit of a number of storage units having storage issues.

The scheduled time that each encoded data slice of a number of encoded data slices having storage issues requires rebuilding depends on the type of data, the length of time of the issue, and the structure of the system. For instance, data that is accessed frequently may require a faster rebuild time. As another example, a system with less reliable storage devices, or less storage devices in general, may require a faster rebuild time to maintain at least a threshold number of encoded data slices within the system. For simplicity, only the three "bad" slices of data object a3 are included in the DSN status information 86 of FIG. 9B as the remaining encoded data slices of data object a3 would have blank entries for time of rebuild and time of storage issue because no storage issues have occurred for those slices. Here, EDS 1_1_a3 requires rebuilding in at least 1 hour, EDS 2_1_a3 requires rebuilding in at least 5 minutes, and EDS 1_Y_a3 requires rebuilding in at least 2 hours. Because these slices are from the same data and are within the same system, the difference in rebuild time is based on how long each slice has had its corresponding issue (e.g., EDS 2_1_a3 has had its storage issue the longest).

The length of time that each encoded data slice and/or each storage has had its corresponding storage issue is shown in FIG. 9B as being either old, somewhat recent, or a recent storage issue. An old storage issue means the encoded data slice or storage unit has had the storage issue for a day or up to a year depending on what "old" is in relation to the storage system type. For example, an issue lasting longer than a day may be considered old for a computer hard drive while an issue lasting longer than a year may be considered old for an archival storage system. A recent storage issue indicates that the encoded data slice or storage unit has had the storage issue for the last couple of milliseconds or up to a week depending on the storage system type. For example, an issue lasting no longer than a few milliseconds may be considered recent for a computer hard drive while an issue lasting no longer than a few weeks may be considered recent for an archival storage system. The somewhat recent category is between the old and recent categories and depends on the storage system type. Here, SU #1_1 has an old storage issue, SU #1_2 has a somewhat recent storage issue, SU #1_n has a recent storage issue, EDS 1_1_a3 has a somewhat recent storage issue, EDS 2_1_a3 has an old storage issue, and EDS 1_Y_a3 has a recent storage issue.

The priority level of rebuilding encoded data slices and the priority level of the storage unit remedy are based on how long the encoded data slice or storage unit has had the storage issue as well as other factors from the storage unit status information 82 and the data object storage status information 84. For example, EDS 2_1_a3 requires rebuilding within 5 minutes and is one of two bad slices of the same data segment. Therefore, EDS 2_1_a3 has been given a rebuild priority of "high." Further, storage unit #1_1 has had an "old" storage issue, low reliability, low data throughput, high usage, and 3 "bad slices. Therefore, storage unit #1_1 has a storage unit remedy priority level of "high." As another example, storage unit #1_n has a storage unit priority level of "medium" because it has only medium reliability, medium storage unit usage, and has 2 "bad" slices.

Based on the DSN status information 86, the managing unit 18 identifies DSN memory issues. The managing unit 18 identifies DSN memory issues by one or more of identifying encoded data slices of the plurality of encoded data slices to rebuild, identifying one or more of the plurality of storage units to repair, identifying one or more memory devices of a storage unit to repair, identifying one or more of the plurality of storage units to replace, identifying one or more memory devices of a storage unit to replace, and determining to add another storage unit to the DSN memory. The managing unit then prioritizes corrective remedies 88 for the DSN memory issues based on the DSN status information 86 of the DSN memory 22.

For example, when the DSN memory issue is to rebuild an encoded data slice, a corrective remedy of the corrective remedies includes a rebuilding function. When the DSN memory issue is to repair one or more of the plurality of storage units, a second corrective remedy of the corrective remedies includes taking the one or more plurality of storage units offline for repair. When the DSN memory issue is to replace one or more memory devices of a storage unit of the plurality of storage units, a third corrective remedy of the corrective remedies includes transferring encoded data slices from the one or more memory devices to one or more new memory device of the storage unit. When the DSN memory issue is to replace one or more of the plurality of storage units, a fourth corrective remedy of the corrective remedies includes transferring encoded data slices stored by the one or more plurality of storage units to one or more new storage units. When the DSN memory issue is limited available memory space, a fifth corrective remedy of the corrective remedies includes adding another storage unit to the DSN memory and reallocating DSN logical address space among the plurality of storage units and the other storage unit.

The managing unit 18 prioritizes corrective remedies for the most problematic DSN memory issues (e.g., those with a "high" priority level of rebuild and a "high" priority level of storage unit remedy). For example, the managing unit 18 prioritizes rebuilding encoded data slices of a set of encoded data slices of the plurality of sets of encoded data slices having the greatest number of encoded data slices having storage issues compared to other sets of encoded data slices of the plurality of sets of encoded data slices. The managing unit prioritizes rebuilding encoded data slices of the plurality of sets of encoded data slices that have had storage issues for a predetermined amount of time (e.g., longer than 3 hours). The managing unit also prioritizes rebuilding encoded data slices of the plurality of sets of encoded data slices having storage issues of a particular type of storage issue when the amount of encoded data slices having the particular type of storage issue has reached a predetermined size (e.g., bad slice(s) of more than a predetermined number of bytes). Further, the managing unit prioritizes one or more of: replacing a storage unit of the plurality of storage units having a storage issue; repairing the storage unit having the storage issue; replacing a memory device of the storage unit having the storage issue; and repairing the memory device of the storage unit having the storage issue when the storage unit having the storage issue is responsible for a number of encoded data slices of the plurality of encoded data slices having storage issues that is greater than the number of encoded data slices having storage issues stored by other storage units of the plurality of storage units (e.g., the priority level of a storage unit remedy is high).

As an example, the DSN status information 86 of FIG. 9B indicates several DSN memory issues. The managing unit 18 identifies a first DSN memory issue as the repair or replacement of SU #1_1 or the memory devices therein because SU #1_1 has a high level of storage unit remedy, stores 3 bad slices, and has had several other issues (e.g., low data throughput, etc.) for a long period of time. It is possible that the slices are bad (e.g., missing or corrupt) because of SU #1_1 issues. A second DSN memory issue is that SU #1_1 has limited available memory and both SU #1_1 and SU #1_2 have high storage unit usage indicating that perhaps another storage unit may need to be added to storage group #1 of the DSN memory 22.

A third DSN memory issue is that SU #1_n may also require repairing or replacing in the near future because it has relatively low available memory, a medium reliability, medium usage, and stores 2 bad slices. Other DSN memory issues are that EDS 1_1_a3, EDS 2_1_a3, and EDS 1_Y_a3 require rebuilding. The managing unit 18 determines that out the DSN memory issues identified, the replacing or repairing of SU #1_1 is a high priority because it stores the most bad slices in comparison to other storage units in the DSN memory. Also, rebuilding EDS 2_1_a3 has a high priority level because it is 1 of 2 bad slices of the same set of encoded data slices (e.g., from the same data segment of the data object). In this example, a data segment has a pillar number of 5 and a decode threshold number of 3. If more than one slice in a set of encoded data slices are corrupt, missing, or a wrong revision, the rebuild priority goes up. The other bad slice in the set, EDS 1_1_a3, requires rebuilding in 1 hour whereas EDS 2_1_a3 requires rebuilding in 5 minutes. Therefore, the rebuilding of EDS 2_1_a3 is prioritized over the rebuilding of EDS 1_1_a3.

After identifying the prioritized corrective remedies, the managing unit 18 facilitates execution of the prioritized corrective remedies to correct the DSN memory issues. The managing unit executes the corrective remedy and/or requests another computing device of the DSN to execute the corrective remedy. In this example, the managing unit 18 will either take SU #1_1 offline for repair or transfer the encoded data slices stored on SU #1_1 to one or more new memory devices. The managing unit 18 will also initiate a rebuilding function to rebuild EDS 2_1_a3.

Figure 10:
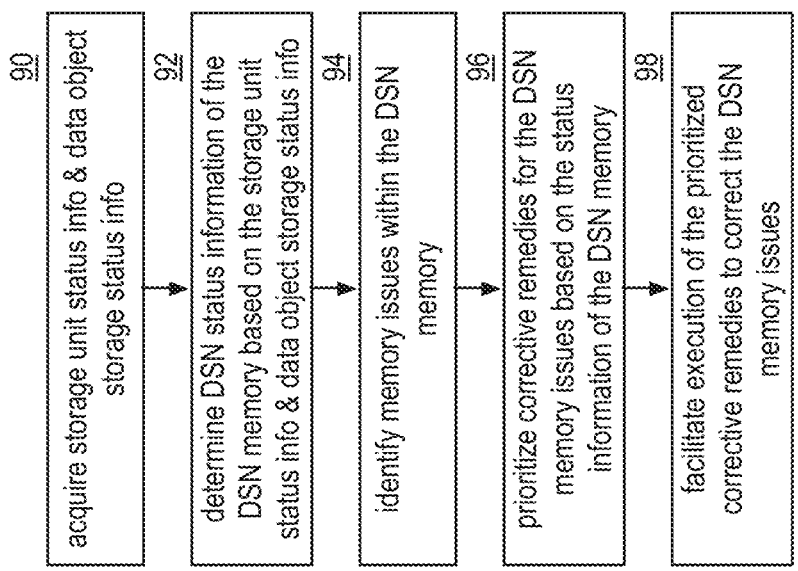
FIG. 10 is a logic diagram of an example of a method of identifying and remedying dispersed storage network (DSN) memory issues in accordance with the present invention.

FIG. 10 is a logic diagram of an example of a method of identifying and remedying dispersed storage network (DSN) memory issues. The method begins with step 90 where a managing unit of the DSN acquires storage unit status information and data object storage status information from the plurality of storage units of the DSN memory and organizes the information using a dispersed data structure, log, table, database or other mechanism. The storage unit status information includes the storage unit name, memory availability, storage unit reliability, data throughput, error rate, storage unit usage rate, and the number of encoded data slices of each storage unit of the plurality of storage units having a storage unit storage issue. The storage unit status information (with the exception of storage unit reliability) may indicate a storage issue at the storage unit level and/or the memory device level.

The data object storage status information includes the data object name, the size of the data object (including the number of data segments per object and the number of encoded data slices per segment), the total number of encoded data slices of the plurality of sets of encoded data slices having a data object storage issue, and the number of encoded data slices of each set of encoded data slices of the sets of encoded data slices of the data object having a data object storage issue from the identified encoded data slices. To acquire the encoded data slice information of the storage unit status information and data object storage status information the managing unit issues a plurality of list requests to the plurality of storage units of the DSN memory. A list request of the plurality of list requests includes a request for a list of slice names regarding encoded data slices stored by a storage unit of the plurality of storage units.

The managing unit interprets the list of slice names to identify encoded data slices having a storage issue. The storage issue includes one or more of a storage unit storage issue and a data object storage issue. For each identified encoded slice of the identified encoded data slices having the storage issue, the managing unit further determines whether the type of storage issue is one of a missing encoded data slice, a wrong revision, and a corrupted encoded data slice. When the type of storage issue is one of the missing encoded data slice and the corrupted encoded data slice, the managing unit determines the storage unit issue to be a storage unit storage issue. For example, the encoded data slice could be missing because the storage unit was offline and never received the encoded data slice for storage. Further, the encoded data slice could be missing because the storage unit received it but stored it in a failed memory device. The encoded data slice may be intentionally corrupted or unintentionally corrupted (e.g., by a software or hardware glitch). When the type of storage issue is one of the missing encoded data slice, the wrong revision, and the corrupted encoded data slice, the managing unit determines the storage unit issue to be a data object storage issue. An encoded data slice is a wrong revision encoded data slice when it is of a different (e.g., old) revision than other encoded data slices in the set of encoded data slices. This may occur due to a DS processing error. The encoded data slice may be missing or corrupted for other reasons besides storage unit malfunctions. For example, the encoded data slice may be missing due to a DS processing or user error. Whether a storage unit issue caused the missing or corrupted encoded data slice or not, the information is included as a data object storage issue because it is an indicator of overall data object health.

Therefore, from the list of identified encoded data slices, the managing unit determines the number of encoded data slices of each storage unit of the plurality of storage units having a storage unit storage issue, and the total number of encoded data slices of the plurality of sets of encoded data slices having a data object storage issue. By using the encoded data slice name of the identified encoded data slices and data object size information of the data object storage status information, the managing unit is also able to determine the number of encoded data slices of each set of encoded data slices of the sets of encoded data slices of the data object having a data object storage issue. The managing unit adds this information to the storage unit status information and the data object storage status information organized in the dispersed data structure, log, table, database or other mechanism.

The method continues with step 92 where the managing unit determines DSN status information of the DSN memory based on the storage unit status information and the data object storage status information. The managing unit determines the DSN status information by determining one or more of: a scheduled time that each encoded data slice of a number of encoded data slices having storage issues requires rebuilding, a length of time that each encoded data slice of the number of encoded data slices having storage issues has had its corresponding storage issue, a length of time that each storage unit of a number of storage units having storage issues has had its corresponding storage issue, a rebuilding priority level for each encoded data slice of the number of encoded data slices having storage issues, and a storage unit remedy priority level for each storage unit of a number of storage units having storage issues.

Based on the DSN status information of the DSN memory, the method continues with step 94 where the managing unit identifies DSN memory issues within the DSN memory. Identifying DSN memory issues includes one or more of identifying encoded data slices of the plurality of encoded data slices to rebuild, identifying one or more of the plurality of storage units to repair, identifying one or more memory devices of a storage unit to repair, identifying one or more of the plurality of storage units to replace, identifying one or more memory devices of a storage unit to replace, and determining to add another storage unit to the DSN memory.

The method continues with step 96 where the managing unit prioritizes corrective remedies for the DSN memory issues based on the DSN status information of the DSN memory. For example, when the DSN memory issue is to rebuild an encoded data slice, a corrective remedy of the corrective remedies includes a rebuilding function. When the DSN memory issue is to repair one or more of the plurality of storage units, a second corrective remedy of the corrective remedies includes taking the one or more plurality of storage units offline for repair. When the DSN memory issue is to replace one or more memory devices of a storage unit of the plurality of storage units, a third corrective remedy of the corrective remedies includes transferring encoded data slices from the one or more memory devices to one or more new memory device of the storage unit. When the DSN memory issue is to replace one or more of the plurality of storage units, a fourth corrective remedy of the corrective remedies includes transferring encoded data slices stored by the one or more plurality of storage units to one or more new storage units. When the DSN memory issue is limited available memory space, a fifth corrective remedy of the corrective remedies includes adding another storage unit to the DSN memory and reallocating DSN logical address space among the plurality of storage units and the other storage unit.

The managing unit prioritizes corrective remedies for the most problematic DSN memory issues. For example, the managing unit prioritizes rebuilding encoded data slices of a set of encoded data slices of the plurality of sets of encoded data slices having the greatest number of encoded data slices having storage issues compared to other sets of encoded data slices of the plurality of sets of encoded data slices. The managing unit prioritizes rebuilding encoded data slices of the plurality of sets of encoded data slices that have had storage issues for a predetermined amount of time (e.g., longer than 3 hours). The managing unit also prioritizes rebuilding encoded data slices of the plurality of sets of encoded data slices having storage issues of a particular type of storage issue when the amount of encoded data slices having the particular type of storage issue has reached a predetermined size (e.g., bad slice(s) of more than a certain amount of bytes). Further, the managing unit prioritizes one or more of: replacing a storage unit of the plurality of storage units having a storage issue; repairing the storage unit having the storage issue; replacing a memory device of the storage unit having the storage issue; and repairing the memory device of the storage unit having the storage issue when the storage unit having the storage issue is responsible for a number of encoded data slices of the plurality of encoded data slices having storage issues that is greater than the number of encoded data slices having storage issues stored by other storage units of the plurality of storage units (e.g., the priority level of a storage unit remedy is high).

After identifying the prioritized corrective remedies, the method continues with step 98 where the managing unit facilitates execution of the prioritized corrective remedies to correct the DSN memory issues. For example, the managing unit can execute the corrective remedy and/or request another computing device of the DSN to execute the corrective remedy.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
acquiring, by a managing unit of a dispersed storage network (DSN), storage unit status information and data object storage status information from a plurality of storage units of DSN memory of the DSN, wherein the plurality of storage units of the DSN memory store a plurality of sets of encoded data slices, wherein a data segment of a data object is dispersed error encoded into a set of encoded data slices of the plurality of sets of encoded data slices, and the storage unit status information is a compilation of a status of health of each storage unit in the DSN memory;
determining, by the managing unit, DSN status information of the DSN memory based on the storage unit status information and the data object storage status information;
identifying, by the managing unit, DSN memory issues within the DSN memory based on the DSN status information of the DSN memory, wherein the identifying DSN memory issues includes identifying one or more storage units of the plurality of storage units of the DSN memory to repair and limited available memory space of the DSN memory;
prioritizing, by the managing unit, corrective remedies for the DSN memory issues based on the DSN status information of the DSN memory, wherein the prioritizing of corrective remedies includes repairing the one or more storage units of the plurality of storage units of the DSN memory having the storage issue and adding another storage unit to the DSN memory; and
facilitating, by the managing unit, execution of the prioritized corrective remedies to correct the DSN memory issues, wherein:
when a DSN memory issue of the DSN memory issues is to repair the one or more storage units of the plurality of storage units of the DSN memory, a first corrective remedy of the corrective remedies includes taking the one or more storage units offline for repair, and
when the DSN memory issue is limited available memory space, a second corrective remedy of the corrective remedies includes adding another storage unit to the DSN memory and reallocating DSN logical address space among the plurality of storage units and the other storage unit.

2. The method of claim 1, wherein:
the storage unit status information further includes one or more of:
memory availability;
storage unit reliability;
data throughput;
error rate;
storage unit usage rate; and
a number of encoded data slices of each storage unit of the plurality of storage units having a storage unit storage issue; and
the data object storage status information includes one or more of:
a data object size;
a total number of encoded data slices of the plurality of sets of encoded data slices having a data object storage issue; and
a number of encoded data slices of each set of encoded data slices of the sets of encoded data slices of the data object having a storage issue.

3. The method of claim 2, wherein the acquiring comprises:
issuing, by the managing unit, a plurality of list requests to the plurality of storage units, wherein a list request of the plurality of list requests includes a request for a list of slice names regarding encoded data slices stored by a storage unit of the plurality of storage units;
interpreting, by the managing unit, the list of slice names to identify encoded data slices having a storage issue, wherein the storage issue includes one or more of the storage unit storage issue and the data object storage issue;
determining, by the managing unit, the number of encoded data slices of each storage unit of the plurality of storage units having the storage unit storage issue from the identified encoded data slices;
determining, by the managing unit, the total number of encoded data slices of the plurality of sets of encoded data slices having the data object storage issue from the identified encoded data slices; and
determining, by the managing unit, the number of encoded data slices of each set of encoded data slices of the sets of encoded data slices of the data object having the data object storage issue from the identified encoded data slices.

4. The method of claim 3, further comprising for each identified encoded data slice of the identified encoded data slices having the storage issue:
determining, by the managing unit, a type of storage issue from a plurality of types of storage issues, wherein the plurality of types of storage issues includes two or more of:
a missing encoded data slice;
a wrong revision; and
a corrupted encoded data slice; and
determining, by the managing unit, that the storage issue of the identified encoded data slice is the storage unit storage issue when the type of storage issue is one of:
the missing encoded data slice; and
the corrupted encoded data slice; and
determining, by the managing unit, that the storage issue of the identified encoded data slice is the data object storage issue when the type of storage issue is one of:
the missing encoded data slice;
the wrong revision; and
the corrupted encoded data slice.

5. The method of claim 1, wherein the determining the DSN status information comprises:
determining, by the managing unit, one or more of:
a scheduled time that each encoded data slice of a number of encoded data slices having storage issues requires rebuilding;
a length of time that each encoded data slice of the number of encoded data slices having storage issues has had its corresponding storage issue;
a length of time that each storage unit of a number of storage units having storage issues has had its corresponding storage issue;
a rebuilding priority level for each encoded data slice of the number of encoded data slices having storage issues; and
a storage unit remedy priority level for each storage unit of the number of storage units having storage issues.

6. The method of claim 1, wherein the identifying the DSN memory issues comprises one or more of:
identifying encoded data slices of the plurality of encoded data slices to rebuild;
identifying one or more memory devices of a storage unit to repair;
identifying one or more of the plurality of storage units to replace; and
identifying the one or more memory devices of the storage unit to replace.

7. The method of claim 1, wherein:
when the DSN memory issue of the DSN memory issues is to rebuild an encoded data slice, a third corrective remedy of the corrective remedies includes a rebuilding function;
when the DSN memory issue is to replace one or more memory devices of a storage unit of the plurality of storage units, a third fourth corrective remedy of the corrective remedies includes transferring encoded data slices from the one or more memory devices to one or more new memory devices of the storage unit; and
when the DSN memory issue is to replace one or more storage units of the plurality of storage units, a fifth corrective remedy of the corrective remedies includes transferring encoded data slices stored by the one or more storage units of the plurality of storage units to one or more new storage units.

8. The method of claim 1, wherein the prioritizing comprises one or more of:
prioritizing, by the managing unit, rebuilding encoded data slices of the set of encoded data slices of the plurality of sets of encoded data slices having a greatest number of encoded data slices having storage issues compared to other sets of encoded data slices of the plurality of sets of encoded data slices;
prioritizing, by the managing unit, rebuilding encoded data slices of the plurality of sets of encoded data slices that have had the storage issues for a predetermined amount of time;
prioritizing, by the managing unit, rebuilding the encoded data slices of the plurality of sets of encoded data slices having storage issues of a particular type of storage issue when an amount of encoded data slices having the particular type of storage issue has reached a predetermined size; and
prioritizing, by the managing unit, one or more of: replacing a storage unit of the plurality of storage units having a storage issue; replacing a memory device of the storage unit having the storage issue; and repairing the memory device of the storage unit having the storage issue when the storage unit having the storage issue is responsible for a number of encoded data slices of the plurality of encoded data slices having storage issues that is greater than a number of encoded data slices having storage issues stored by other storage units of the plurality of storage units.

9. The method of claim 8, further comprising organizing, by the managing unit, the storage unit status information and the data object storage status information using a dispersed data structure.

10. The method of claim 9, wherein the data object storage status information is a compilation of a status of health of each data object stored in the DSN memory.

11. The method of claim 10, wherein the data object storage status information is organized as a log.

12. The method of claim 11, wherein the storage unit status information includes a storage unit name, an available memory, a reliability, a data throughput, an error rate, a usage, and a number of missing or corrupted encoded data slices.

13. A managing unit of a dispersed storage network (DSN), the managing unit comprises:
an interface;
memory; and
a processing module operably coupled to the memory and the interface, wherein the processing module is operable to:
acquire storage unit status information and data object storage status information from a plurality of storage units of DSN memory of the DSN, wherein the plurality of storage units store a plurality of sets of encoded data slices, wherein a data segment of a data object is dispersed error encoded into a set of encoded data slices of the plurality of sets of encoded data slices, and the storage unit status information is a compilation of a status of health of each storage unit in the DSN memory;
determine DSN status information of the DSN memory based on the storage unit status information and the data object storage status information;
identify DSN memory issues within the DSN memory based on the DSN status information of the DSN memory, wherein the identifying DSN memory issues includes identifying one or more memory devices of a storage unit of the plurality of storage units having a storage issue;
prioritize corrective remedies for the DSN memory issues based on the DSN status information of the DSN memory, wherein one of the corrective remedies is replacing the one or more memory devices of the storage unit of the plurality of storage units having the storage issue; and
facilitate execution of the prioritized corrective remedies to correct the DSN memory issues, wherein:
when the DSN memory issue is to replace the one or more memory devices of the storage unit of the plurality of storage units, a first corrective remedy of the corrective remedies includes transferring encoded data slices from the one or more memory devices to one or more new memory devices of the storage unit.

14. The managing unit of claim 13, wherein:
the storage unit status information further includes one or more of:
   memory availability;
   storage unit reliability;
   data throughput;
   error rate;
   storage unit usage rate; and
   a number of encoded data slices of each storage unit of the plurality of storage units having a storage unit storage issue; and
the data object storage status information includes one or more of:
   a data object size;
   a total number of encoded data slices of the plurality of sets of encoded data slices having a data object storage issue; and
   a number of encoded data slices of each set of encoded data slices of the sets of encoded data slices of the data object having a data object storage issue.

15. The managing unit of claim 13, wherein the processing module is operable to acquire by:
   issuing a plurality of list requests to the plurality of storage units, wherein a list request of the plurality of list requests includes a request for a list of slice names regarding encoded data slices stored by a storage unit of the plurality of storage units;
   interpreting the list of slice names to identify encoded data slices having a storage issue;
   determining, by the managing unit, the number of encoded data slices of each storage unit of the plurality of storage units having the storage unit storage issue from the identified encoded data slices;
   determining, by the managing unit, the total number of encoded data slices of the plurality of sets of encoded data slices having the data object storage issue from the identified encoded data slices; and
   determining, by the managing unit, the number of encoded data slices of each set of encoded data slices of the sets of encoded data slices of the data object having the data object storage issue from the identified encoded data slices.

16. The managing unit of claim 15, wherein the processing module is further operable to:
   for each identified encoded slice of the identified encoded data slices having the storage issue:
      determine a type of storage issue from a plurality of types of storage issues, wherein the plurality of types of storage issues includes two or more of:
         a missing encoded data slice;
         a wrong revision; and
         a corrupted encoded data slice; and
      determine that the storage issue of the identified encoded data slice is the storage unit storage issue when the type of storage issue is one of:
         the missing encoded data slice; and
         the corrupted encoded data slice; and
      determine that the storage issue of the identified encoded data slice is the data object storage issue when the type of storage issue is one of:
         the missing encoded data slice;
         the wrong revision; and
         the corrupted encoded data slice.

17. The managing unit of claim 13, wherein the processing module is operable to determine the DSN status information by:
   determining one or more of:
      a scheduled time that each encoded data slice of a number of encoded data slices having storage issues requires rebuilding;
      a length of time that each encoded data slice of the number of encoded data slices having storage issues has had its corresponding storage issue;
      a length of time that each storage unit of a number of storage units having storage issues has had its corresponding storage issue;
      a rebuilding priority level for each encoded data slice of the number of encoded data slices having storage issues; and
      a storage unit remedy priority level for each storage unit of the number of storage units having storage issues.

18. The managing unit of claim 13, wherein the processing module is operable to identify the DSN memory issues by one or more of:
   identifying encoded data slices of the plurality of encoded data slices to rebuild;
   identifying one or more of the plurality of storage units to repair;
   identifying one or more memory devices of a storage unit to repair;
   identifying one or more of the plurality of storage units to replace; and
   determining to add another storage unit to the DSN memory.

19. The managing unit of claim 13, wherein:
   when the DSN memory issue of the DSN memory issues is to rebuild an encoded data slice, a second corrective remedy of the corrective remedies includes a rebuilding function;
   when the DSN memory issue is to repair one or more storage units of the plurality of storage units, a third corrective remedy of the corrective remedies includes taking the one or more plurality of storage units offline for repair;
   when the DSN memory issue is to replace one or more storage units of the plurality of storage units, a fourth corrective remedy of the corrective remedies includes transferring encoded data slices stored by the one or more storage units of the plurality of storage units to one or more new storage units; and
   when the DSN memory issue is limited available memory space, a fifth corrective remedy of the corrective remedies includes adding another storage unit to the DSN memory and reallocating DSN logical address space among the plurality of storage units and the other storage unit.

20. The managing unit of claim 13, wherein the processing module is operable to prioritize by one or more of:
   prioritizing rebuilding encoded data slices of the set of encoded data slices of the plurality of sets of encoded data slices having a greatest number of encoded data slices having storage issues compared to other sets of encoded data slices of the plurality of sets of encoded data slices;
   prioritizing rebuilding encoded data slices of the plurality of sets of encoded data slices that have had storage issues for a predetermined amount of time;
   prioritizing rebuilding encoded data slices of the plurality of sets of encoded data slices having storage issues of a particular type of storage issue when an amount of encoded data slices having the particular type of storage issue has reached a predetermined size; and prioritizing one or more of: replacing a storage unit of the plurality of storage units having a storage issue; repairing the storage unit having the storage issue; and repairing the memory device of the storage unit having the storage issue when the storage unit having the storage issue is responsible for a number of encoded data slices of the plurality of encoded data slices having storage issues that is greater than a number of encoded data slices having storage issues stored by other storage units of the plurality of storage units.

* * * * *